United States Patent
Bryden et al.

(10) Patent No.: US 9,356,177 B2
(45) Date of Patent: May 31, 2016

(54) METHOD OF MANUFACTURE OF CHALCOGENIDE-BASED PHOTOVOLTAIC CELLS

(75) Inventors: Todd R. Bryden, Midland, MI (US); Jeffrey L. Fenton, Jr., Lake Jackson, TX (US); Gary E. Mitchell, Midland, MI (US); Kirk R. Thompson, Lake Jackson, TX (US); Michael E. Mills, Midland, MI (US); David J. Parrillo, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 818 days.

(21) Appl. No.: 13/096,316

(22) Filed: Apr. 28, 2011

(65) Prior Publication Data

US 2011/0277840 A1 Nov. 17, 2011

Related U.S. Application Data

(60) Provisional application No. 61/329,728, filed on Apr. 30, 2010.

(51) Int. Cl.
| | |
|---|---|
| *H01L 31/0264* | (2006.01) |
| *H01L 31/0749* | (2012.01) |
| *C23C 14/06* | (2006.01) |
| *C23C 14/34* | (2006.01) |
| *H01L 21/02* | (2006.01) |
| *H01L 31/032* | (2006.01) |

(52) U.S. Cl.
CPC ........ *H01L 31/0749* (2013.01); *C23C 14/0629* (2013.01); *C23C 14/3414* (2013.01); *H01L 21/0237* (2013.01); *H01L 21/02425* (2013.01); *H01L 21/02485* (2013.01); *H01L 21/02557* (2013.01); *H01L 21/02631* (2013.01); *H01L 31/0322* (2013.01); *Y02E 10/541* (2013.01)

(58) Field of Classification Search
CPC .................. H01L 31/0264; H01L 31/0296
USPC ......................................................... 136/260
See application file for complete search history.

(56) References Cited

U.S. PATENT DOCUMENTS

| | | |
|---|---|---|
| 4,349,425 A | 9/1982 | Miyake et al. |
| 5,500,055 A | 3/1996 | Toyama et al. |
| 2005/0009228 A1 | 1/2005 | Wu et al. |

(Continued)

FOREIGN PATENT DOCUMENTS

JP 57115879 7/1982

OTHER PUBLICATIONS

Ayyub et al.; "Photoluminescence enhancement in nanocomposite thin films of CdS—ZnO Photoluminescence enhancement in nanocomposite thin films of CdS—ZnO"; Journal of Applied Physics; 2005; 104310; 97.

(Continued)

*Primary Examiner* — James Lin
*Assistant Examiner* — Dujuan Horton

(57) ABSTRACT

The invention is a method of forming a cadmium sulfide based buffer on a copper chalcogenide based absorber in making a photovoltaic cell. The buffer is sputtered at relatively high pressures. The resulting cell has good efficiency and according to one embodiment is characterized by a narrow interface between the absorber and buffer layers. The buffer is further characterized according to a second embodiment by a relatively high oxygen content.

6 Claims, 1 Drawing Sheet

(56) References Cited

U.S. PATENT DOCUMENTS

2007/0163637 A1*  7/2007  Robinson et al. ............. 136/262
2008/0092945 A1   4/2008  Munteanu et al.
2009/0194165 A1*  8/2009  Murphy et al. ............... 136/260
2010/0055826 A1   3/2010  Zhong

OTHER PUBLICATIONS

Ghosh et al.; "Highly conducting transparent nanocrystalline Cd1-xSbxS thin film synthesized by RF magnetron sputtering and studies on its optical, electrical and field emission properties"; Solar Energy Materials and Solar Cells; 2006; 2616-2629; 90; Elsevier.

Abou-Ras et al.; "Structural and chemical investigations of CBD- and PVD-CdS buffer layers and interfaces in Cu (In, Ga)Se2-based thin film solar cells"; thin solid films; 2005; 118-123; Elsevier.

Finke et al.; "Leaching tests with thin film solar cells based on copper indium diselenide (CIS)"; Chemoshpere; 1996; 1633-1641; 32; 8; Elsevier.

Hur et al.; "Characterization of photoconductive CdS thin films prepared on glass substrates for photoconductive-sensor applications"; Journal of Vacuum Science Technology B; 2008; 1334-1337; 26; 4; American Vacuum Society.

Taneja et al.: "Chemical passivation of sputter-deposited nanocrystalline CdS thin films"; Materials Letters; 2002; 343-347; 54; Elsevier.

Vasa et al.; "Photoconductivity in sputter-deposited CdS and CdS—ZnO nanocomposite thin films"; Journal of Applied Physics: Condensed Matter; 2002; 281; 14.

Hashimoto et al.; "High Efficiency CIGS Solar Cell with Extremely Thin CdS Buffer Layer"; 17th European Photovoltaic Solar Energy Conference; Oct. 2001; pp. 1225-1228; Munich, Germany.

Santamaria et al.; "Electrical Characterization of All-Sputtered CdS/CuInSe2 Solar Cell Heterojunctions"; Jan. 1990; vol. 28; No. 1; pp. 31-39; Elsevier Sequoia.

Wu et al.; "High-Efficiency Polycrystaqlline CdTe Thin-Film Solar Cells With an Oxygenated Amorphous CdS (a-CdS:O) Window Layer"; 2002; pp. 531-534; IEEE.

* cited by examiner

METHOD OF MANUFACTURE OF CHALCOGENIDE-BASED PHOTOVOLTAIC CELLS

FIELD OF THE INVENTION

This invention relates to a method of manufacture of chalcogenide-based photovoltaic cells and particularly to a method of forming a buffer layer in such cells and the cells made by this method.

BACKGROUND OF THE INVENTION

Photovoltaic cells can be made using p-type chalcogenide based materials as absorber layers which convert incident light or radiation to electrical energy. These p-type chalcogenides are typically selenides, sulfides or sulfide selenides of at least one, and more typically at least two or three of the following metals: Cu, In, Ga, Al (referred to herein as CIS, CISS, CIAS, CIASS, CIGS, CIGSS, or CIAGSS depending upon the combination of elements used). Using a CdS based buffer layer near or adjacent to the p-type chalcogenide is also known.

It is known that CdS layers can be formed on various substrates by chemical bath deposition, physical vapor deposition or sputtering. See e.g. Abou-Ras et al (Thin Solid Films 480-481 (2005) 118-123) and 5,500,055. Abou-Ras specifically looked at the effect of deposition method comparing CBD deposition to PVD deposition and observed that CBD deposition of the CdS created more efficient cells compared with cells made with PVD. Abou-Ras proposes that the lack or decrease of interdiffusion at the CIGS-CdS interface in the case of PVD deposited cells is a reason for their decreased efficiencies.

SUMMARY OF THE INVENTION

Applicants have surprisingly found that sputtering CdS onto the p-type chalcogenide at relatively high pressures in a substantially inert atmosphere leads to less interdiffusion with the underlying chalcogenide absorber than does sputtering at the traditional low pressure sputtering conditions but also leads to higher cell efficiencies than does the traditional low pressure sputtering. This is particularly unexpected in view of Abou-Ras's teaching.

Thus, according to one embodiment, the invention is a method comprising
  forming a chalcogenide-based absorber layer on a substrate,
  forming a buffer layer comprising cadmium and sulfur on the absorber by sputtering in an inert atmosphere at a working pressure of from 0.08 to 0.12 mbar (0.06 to 0.09 torr or 8-12 Pa).

This invention is also a photovoltaic cell made by the preceding method. The cells made by this method are characterized by interdiffusion between the CdS and absorber layer. The interdiffusion interface region is defined at the absorber region by the point at which the atomic fraction of cadmium exceeds 0.05 in energy dispersive x-ray spectroscopy (EDS) scans of cross section of the cell and defined at the buffer region by the point at which the atomic fraction of indium and selenium is less than 0.05 and preferably the atomic fraction of copper is less than 0.10. The atomic fraction is based on total atomic amounts of copper, indium, gallium, selenium, cadmium, sulfur, and oxygen. The grain size of the cadmium sulfide grains preferably is less than 50 nm, more preferably less than 30 nm, and most preferably less than 20 nm. Thus, according to one embodiment the invention is a photovoltaic cell comprising a backside electrode (also referred to herein as a backside electrical contact or backside electrical collector), a chalcogenide-based absorber in contact with the backside electrode, a cadmium sulfide based buffer layer on the absorber, a transparent conductive layer located at the opposite side of the buffer layer from the absorber layer, an electrical collector on the transparent conductive layer, wherein the cell has an interface between the absorber and the buffer of less than 10 nm thickness and the buffer preferably has an average grain size of less than 50 nm.

Surprisingly, although the cadmium sulfide preferably is sputtered in an inert environment, the buffer layer of the cells made by this invention has a significant amount of oxygen. Thus, according to another embodiment this invention is a photovoltaic cell comprising a backside electrode, a chalcogenide based absorber in contact with the backside electrode, a cadmium sulfide based buffer layer on the absorber, a transparent conductive layer located at the opposite side of the buffer layer from the absorber layer, an electrical collector on the transparent conductive layer, wherein the atomic fraction of oxygen in the cadmium sulfide based buffer layer is at least 0.20.

Also, surprisingly the thickness of the buffer layer may be very low while still yielding effective cells while providing the additional benefit of low cadmium leachate from the cell. Thus, according to yet another embodiment the invention is a photovoltaic cell comprising a backside electrode, a chalcogenide-based absorber in contact with the backside electrode, a cadmium sulfide based buffer layer on the absorber, a transparent conductive layer located at the opposite side of the buffer layer from the absorber layer, an electrical collector on the transparent conductive layer, wherein the thickness of the buffer layer no greater than 30 nm, preferably no greater than 20 nm, and most preferably no greater than 15 nm. The amount of Cadmium that leaches from the article under the USEPA Toxicity Characteristic Leaching Procedure Test 1311 (1992) is no greater than 1 mg/l (i.e. 1 mg of cadmium per liter of leachant solution as specified in the protocol) preferably no greater than 0.8 mg/l, and most preferably no greater than 0.7 mg/l.

DETAILED DESCRIPTION OF THE INVENTION

The method of this invention includes forming a chalcogenide based absorber layer (absorbs electromagnetic radiation at relevant wavelengths and converts to electrical energy) on a substrate and then forming a cadmium sulfide buffer layer on that absorber. When the method is used to form a photovoltaic device, additional layers as are known in the photovoltaic arts also will typically be added. For example, the substrate will typically include or bear backside electrical contacts. A transparent conductive layer will be found above the buffer and a electrical collector system (e.g. a grid) will typically be located above the transparent conductive layer. An optional window layer may be used and protective layers may be applied over the transparent conductive layer and/or the electrical collector. With the exception of the cadmium sulfide based buffer layer, these additional layers may be formed by any method known in the art.

Figure 1:
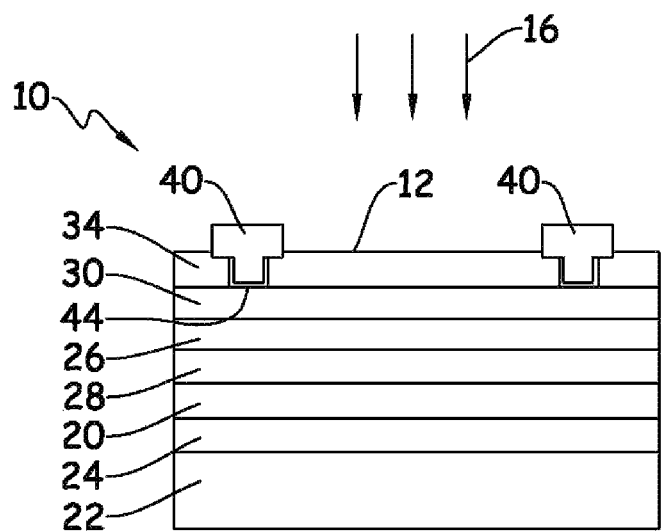
FIG. 1 is a schematic of a cross section of a representative cell according to the present invention.

FIG. 1 shows one embodiment of a photovoltaic article 10 that may be made by processes of the invention. This article 10 comprises a substrate incorporating a support 22, a backside electrical contact 24, and a chalcogenide absorber 20. The article 10 further includes a buffer region 28 incorporating an n-type chalcogenide composition of the present invention, an optional front side electrical contact window region 26, a transparent conductive region 30, a collection grid 40, and an optional bather region 34 to help protect and isolate the article 10 from the ambient. Each of these components is shown in FIG. 1 as including a single layer, but any of these independently can be formed from multiple sublayers as desired. Additional layers (not shown) conventionally used in photovoltaic cells as presently known or hereafter developed may also be provided. As used occasionally herein, the top 12 of the cell is deemed to be that side which receives the incident light 16. The method of forming the cadmium sulfide based layer on the absorber can also be used in tandem cell structures where two cells are built on top of each other each with an absorber that absorbs radiation at different wavelengths.

The support 22 may be a rigid or flexible substrate. Support 22 may be formed from a wide range of materials. These include glass, quartz, other ceramic materials, polymers, metals, metal alloys, intermetallic compositions, paper, woven or non-woven fabrics, combinations of these, and the like. Stainless steel is preferred. Flexible substrates are preferred to enable maximum utilization of the flexibility of the thin film absorber and other layers.

The backside electrical contact 24 provides a convenient way to electrically couple article 10 to external circuitry. Contact 24 may be formed from a wide range of electrically conductive materials, including one or more of Cu, Mo, Ag, Al, Cr, Ni, Ti, Ta, Nb, W combinations of these, and the like. Conductive compositions incorporating Mo are preferred. The backside electrical contact 24 may also help to isolate the absorber 20 from the support 22 to minimize migration of support constituents into the absorber 20. For instance, backside electrical contact 24 can help to block the migration of Fe and Ni constituents of a stainless steel support 22 into the absorber 20. The backside electrical contact 24 also can protect the support 22 such as by protecting against Se if Se is used in the formation of absorber 20.

The chalcogenide absorber 20 preferably incorporates at least one p-type Group 16 chalcogenide, such as Group 16 selenides, sulfides, and selenides-sulfides that include at least one of copper, indium, and/or gallium. In many embodiments, these materials are present in polycrystalline form. Advantageously, these materials exhibit excellent cross-sections for light absorption that allow absorber 20 to be very thin and flexible. In illustrative embodiments, a typical absorber region 20 may have a thickness in the range from about 300 nm to about 3000 nm, preferably about 1000 nm to about 2000 nm.

Representative examples of such p-type chalcogenides absorbers are selenides, sulfides, tellurides, and/or combinations of these that include at least one of copper, indium, aluminum, and/or gallium. More typically at least two or even at least three of Cu, In, Ga, and Al are present. Sulfides and/or selenides are preferred. Some embodiments include sulfides or selenides of copper and indium. Additional embodiments include selenides or sulfides of copper, indium, and gallium. Aluminum may be used as an additional or alternative metal, typically replacing some or all of the gallium. Specific examples include but are not limited to copper indium selenides, copper indium gallium selenides, copper gallium selenides, copper indium sulfides, copper indium gallium sulfides, copper gallium sulfides, copper indium sulfide selenides, copper gallium sulfide selenides, copper indium aluminum sulfide, copper indium aluminum selenide, copper indium aluminum sulfide selenide, copper indium aluminum gallium sulfide, copper indium aluminum gallium selenide, copper indium aluminum gallium sulfide selenide, and copper indium gallium sulfide selenides. The abosber materials also may be doped with other materials, such as Na, Li, or the like, to enhance performance. In addition, many chalcogen materials could incorporate at least some oxygen as an impurity in small amounts without significant deleterious effects upon electronic properties.

One preferred class of CIGS materials may be represented by the formula $$Cu_a In_b Ga_c Al_d Se_w S_x Te_y Na_z \qquad (A)$$

Wherein, if "a" is defined as 1, then:
"(b+c+d)/a"=1.0 to 2.5, preferably 1.0 to 1.65
"b" is 0 to 2, preferably 0.8 to 1.3
"c" is 0 to 0.5, preferably 0.05 to 0.35
"d" is 0 to 0.5, preferably 0.05 to 0.35, preferably d=0
"(w+x+y)" is 2 to 3, preferably 2 to 2.8
"w" is 0 or more, preferably at least 1 and more preferably at least 2 to 3
"x" is 0 to 3, preferably 0 to 0.5
"y" is 0 to 3, preferably 0 to 0.5
"z" is 0 to 0.5, preferably 0.005 to 0.02

The absorber 20 may be formed by any suitable method using a variety of one or more techniques such as evaporation, sputtering, electrodeposition, spraying, and sintering. One preferred method is co-evaporation of the constituent elements from one or more suitable targets, where the individual constituent elements are thermally evaporated on a hot surface coincidentally at the same time, sequentially, or a combination of these to form absorber 20. After deposition, the deposited materials may be subjected to one or more further treatments to finalize the absorber properties.

Optional layers (not shown) may be used on substrate in accordance with conventional practices now known or hereafter developed to help enhance adhesion between backside electrical contact 24 and the support 22 and/or between backside electrical contact 24 and the absorber region 20. Additionally, one or more barrier layers (not shown) also may be provided over the backside of support 22 to help isolate device 10 from the ambient and/or to electrically isolate device 10.

The buffer region 28 is cadmium sulfide based material deposited on the absorber 20 by sputtering at pressures of at least 0.08 millibar (0.06 torr, 8 Pa), more preferably at least 0.09 millibar (0.067 torr, 9 Pa), and most preferably about 0.1 millibar (0.075 torr, 10 Pa) and no greater than 0.12 millibar (0.09 torr, 12 Pa), more preferably no greater than 0.11 millibar (0.083 torr, 11 Pa). Preferably the atmosphere is inert or a sulfur containing gas, but is most preferably inert.

During such deposition approach, the substrate is typically fixed to or otherwise supported upon a holder within the chamber such as by gripping components, or the like. However, the substrate may be oriented and affixed by a wide variety of means as desired. The substrate may be provided in the chamber in a manner such that the substrate is stationary and/or non-stationary during the treatment. In some embodiments, for instance, the substrate can be supported on a rotatable chuck so that the substrate rotates during the deposition.

One or more targets are operably provided in the deposition system. The targets are compositionally suitable to form the desired cadmium sulfide composition. For instance, to form n-type cadmium sulfide, a suitable target has a composition that includes cadmium and sulfur-containing compounds, and is preferably 99% pure cadmium and sulfur. Alternatively, a cadmium target can be used in the presence of a sulfur containing gas. The resulting film is preferably at least 10 nanometers (nm), more preferably at least 15 nm and is preferably up to about 200 nm, more preferably up to 100 nm, yet more preferably up to 30 nm, still more preferably up to 20 nm and most preferably not more than 15 nm. Since the buffer functions effectively at these yet more, still more and most preferred very thin layers, the amount of cadmium in the cell is relatively low compared to prior art cells. These cells have the added benefit of a low cadmium leachate amount.

While a small amount of interdiffusion in cells made by the method of this invention may occur it is significantly less than is found in when the atmosphere for sputtering is lower pressure. The interdiffusion interface region is defined at the absorber region by the point at which the atomic fraction of cadmium exceeds 0.05 in energy dispersive x-ray spectroscopy scans of cross section of the cell and defined at the buffer region by the point at which the atomic fraction of indium and selenium is less than 0.05 and preferably the atomic fraction of copper is less than 0.10. The atomic fraction is based on total atomic amounts of copper, indium, gallium, selenium, cadmium, sulfur, and oxygen. The grain size of the cadmium sulfide grains preferably is less than 50 nm, more preferably less than 30 nm, and most preferably less than 20 nm. According to this embodiment, the interface region is less than 10 nm, preferably less than 8 nm in thickness.

Atomic fraction can be determined from transmission electron microscope (TEM) line scans using energy dispersive x-ray spectroscopy (EDS). Samples for TEM analysis can be prepared by focused ion beam (FIB) milling using a FEI Strata Dual Beam FIB mill equipped with a Omniprobe lift-out tool. TEM analysis can be performed for example on a FEI Tecnai TF-20XT FEGTEM equipped with a Fischione high angle annular dark field (HAADF) scanning TEM (STEM) detector and EDAX EDS detector. The operating voltage of the TEM can be level suitable for the equipment for example voltages of about 200 keV are useful with the equipment mentioned above.

Spatially-resolved EDS line scans can be acquired in STEM mode from HAADF images. From the 100 nm long line scan, 50 spectra can be acquired using 2 nm spot-to-spot resolution and a STEM probe size of ~1 nm. The full scale spectra (0-20 keV) can be converted into elemental distribution profiles because peak intensity (number of integrated peak counts after background removal) is directly proportional to the concentration (in weight percent) of a certain element. Weight percent is then converted to atomic percentage based on mole weight of the element. Note that as a skilled worker understands peak intensity is corrected for the detector response and the other sample dependent factors. These adjustments are typically made based on manufacturer's parameters for their EDS equipment or other suitable reference standards. Grain size can be determined by standard analysis of TEM bright and dark field images.

The cadmium sulfide layer may contain a small amount of impurities. The cadmium sulfide layer preferably consists essentially of cadmium, sulfur, oxygen and copper. Preferably the atomic fractions of cadmium and sulfur are at least 0.3, the atomic fraction of oxygen is at least 0.2 and the atomic fraction of copper is less than 0.15, more preferably less than 0.10.

The atmosphere for sputtering is preferably an inert gas such as argon, helium or neon. The substrate may be placed at a predetermined distance from and orientation relative to the target(s). In some modes of practice, this distance can be varied during the course of the deposition, if desired. Typically, the distance is in the range from about 50 millimeters (mm) to about 100 mm. Preferably, the distance is from about 60 mm to about 80 mm Prior to starting deposition, the chamber typically is evacuated to a suitable base pressure. In many embodiments, the base pressure is in the range from about $1 \times 10^{-8}$ Torr to about $1 \times 10^{-6}$ Torr.

Conveniently, many modes of practice may be carried out at a temperature in the range of from about 20° C. to about 30° C. Conveniently, many modes of practice may be carried out under ambient temperature conditions. Of course, cooler or warmer temperatures may be used to help control deposition rate, deposition quality, or the like. The deposition may be carried out long enough to provide a layer of n-type material have a desired thickness, uniformity, and/or the like.

Optional window region 2526 which may be a single layer or formed from multiple sublayers, can help to protect against shunts. Window region 26 also may protect buffer region 28 during subsequent deposition of the TC region 30. The window region 26 may be formed from a wide range of materials and often is formed from a resistive, transparent oxide such as an oxide of Zn, In, Cd, Sn, combinations of these and the like. An exemplary window material is intrinsic ZnO. A typical window region 26 may have a thickness in the range from about 1 nm to about 200 nm, preferably about 10 nm to about 150 nm, more preferably about 80 to about 120 nm.

The TCO region 30, which may be a single layer or formed from multiple sublayers, is electrically coupled to the buffer region 28 to provide a top conductive electrode for article 10. In many suitable embodiments, the TCO region 30 has a thickness in the range from about 10 nm to about 1500 nm, preferably about 150 nm to about 200 nm. As shown, the TCO region 30 is in direct contact with the window region 26, but one or more intervening layers optionally may be interposed for a variety of reasons such as to promote adhesion, enhance electrical performance, or the like.

A wide variety of transparent conducting oxides; very thin conductive, transparent metal films; or combinations of these may be incorporated used in forming the transparent conductive region 30. Transparent conductive oxides are preferred. Examples of such TCOs include fluorine-doped tin oxide, tin oxide, indium oxide, indium tin oxide (ITO), aluminum doped zinc oxide (AZO), zinc oxide, combinations of these, and the like. In one illustrative embodiment, TCO region 30 has a dual layer construction in which a first sublayer proximal to the buffer incorporates zinc oxide and a second sublayer incorporates ITO and/or AZO. TCO layers are conveniently formed via sputtering or other suitable deposition technique.

The optional electrical grid collection structure 40 may be deposited over the TCO region 30 to reduce the sheet resistance of this layer. The grid structure 40 preferably incorporates one or more of Ag, Al, Cu, Cr, Ni, Ti, Ta, TiN, TaN, and combinations thereof. Preferably the grid is made of Ag. An optional film of Ni (not shown) may be used to enhance adhesion of the grid structure to the TCO region 30. This structure can be formed in a wide variety of ways, including being made of a wire mesh or similar wire structure, being formed by screen-printing, ink-jet printing, electroplating, photolithography, and metallizing thru a suitable mask using any suitable deposition technique.

A chalcogenide based photovoltaic cell may be rendered less susceptible to moisture related degradation via direct, low temperature application of suitable barrier protection 34 to the top 12 of the photovoltaic article 10. The barrier protection may be a single layer or multiple sublayers. As shown the barrier does not cover the electrical grid structure but a barrier that covered such grid may be used instead or in addition to the barrier shown.

EXAMPLE

Example 1

A photovoltaic cell is prepared as follows. A stainless steel substrate is provided. A niobium and molybdenum backside electrical contact is formed on substrate by sputtering. A copper indium gallium selenide absorber is formed by a 1-stage evaporation process where copper, indium, gallium and selenium are evaporated simultaneously from effusion sources onto the stainless steel substrate, which is held at ~550° C., for ~80 minutes. This process results in an absorber stoichiometry of ~$Cu(In_{0.8}Ga_{0.2})Se_2$ A cadmium sulfide layer is radio frequency (rf) sputtered from a CdS target (99.9+% purity) at 160 watts in the presence of argon and varying pressures as shown in Table 1. The temperature of the substrate is maintained at ≤35° C. and the target to substrate distance is ~90 mm. The approximate thickness of this layer is as noted in Table 1.

On the cadmium sulfide layer, an i-ZnO and Al-doped ZnO was deposited via rf-sputtering. A front side electrical collection grid was deposited on Al-doped ZnO.

Cells made substantially according to the above procedure are tested for efficiency by measuring current-voltage characteristics under illumination. As is shown, efficiency peaked at about 0.1 millibar (10 Pa).

TABLE 1

| Sputtering pressure, mbar | CdS thickness, nm | Number of samples | Mean efficiency, % |
|---|---|---|---|
| 0.002 | 15 | 12 | 6.8 |
| 0.002 | 120 | 3 | 6.9 |
| 0.01 | 15 | 3 | 6.7 |
| 0.02 | 15 | 3 | 7.7 |
| 0.05 | 15 | 3 | 8.2 |
| 0.07 | 15 | 3 | 8.1 |
| 0.10 | 15 | 32 | 9.5 |
| 0.14 | 15 | 4 | 7.5 |

Example 2

Figure 2:
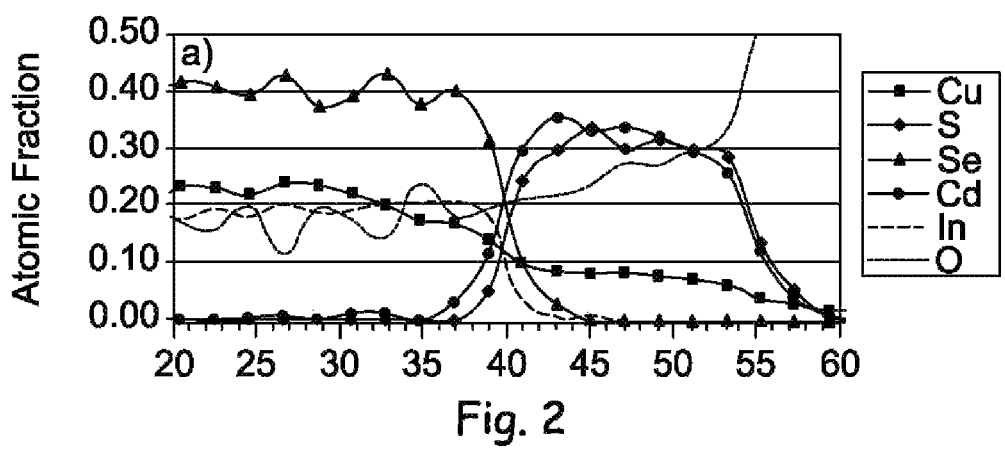
FIG. 2 shows plots of the atomic fraction of a cell made by the present method by sputtering at 0.1 millibar.
Figure 3:
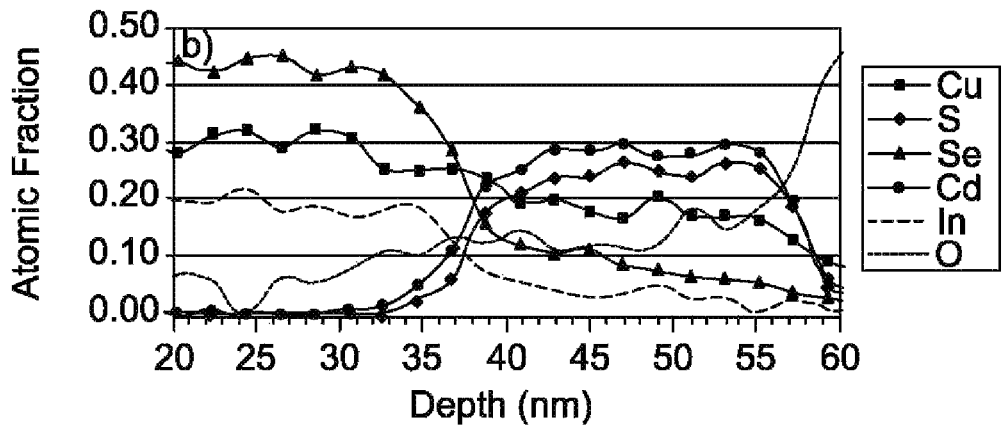
FIG. 3 shows the atomic fraction of a comparative cell made by sputtering at 0.002 millibar.

Cross sections of photovoltaic cells which were prepared substantially according to the method of Example 1 are prepared by focused ion beam as described in the Detailed Description above. See above FIG. 2 and 3 shows the atomic fraction from EDS of a cell made on a copper indium gallium selenide based absorber on which cadmium sulfide is sputtered from a 99.9% purity cadmium sulfide target in an argon atmosphere as described above. FIG. 2) shows the atomic fraction of a cell made by the present method by sputtering at 0.1 millibar. FIG. 3) shows the atomic fraction of a comparative cell made by sputtering at 0.002 millibar. This shows that interdiffusion is limited to about a 10 nm range in the samples formed at higher pressures.

Example 3

Example 1 is repeated using an absorber made by selenization (using elemental selenium) of a sputtered layer containing the elements copper, indium and gallium and varying the pressure during CdS sputtering as shown in Table 2. The absorber formation process proceeds as follows: copper, indium and gallium are deposited on a stainless steel substrate, onto which niobium and molybdenum had been previously deposited, via sputtering from either elemental targets or a target made of an alloy of copper, indium and gallium. Elemental selenium is evaporated onto the coated substrates with the substrate temperature maintained at ≤100° C. This coated substrate is then heated to cause selenization of the copper, indium, gallium precursor.

TABLE 2

| Sputtering pressure, mbar | CdS thickness, nm | Number of samples | Mean efficiency, % |
|---|---|---|---|
| 0.09 | 15 | 1 | 5.9 |
| 0.10 | 15 | 29 | 6.5 |
| 0.12 | 15 | 1 | 4.9 |

What is claimed is:

1. A photovoltaic cell comprising a backside electrode, a chalcogenide based absorber in contact with the backside electrode, a buffer layer comprising cadmium and sulfur on the absorber, a transparent conductive layer located at the opposite side of the buffer layer from the absorber layer, an electrical collector on the transparent conductive layer, wherein the cell has an interface between the absorber and the buffer layer said interface defined on one side by the point at which the atomic fraction of cadmium exceeds 0.05 in energy dispersive spectroscopy scans of cross section of the cell and defined on a second side by the point at which the atomic fraction of indium and selenium is less than 0.05 and said interface having a thickness of less than 10 nm.

2. The cell of claim 1 wherein the buffer has an average grain size of less than 50 nm.

3. The cell of claim 2 wherein the average grain size is less than 20 nm.

4. The cell of claim 2 wherein the buffer consists essentially of cadmium sulfur, copper and oxygen and the atomic fractions of cadmium and sulfur are at least 0.30.

5. The cell of claim 1 wherein the thickness of the buffer layer is less than 30 nm.

6. The cell of claim 1 wherein cadmium leachate from the cell is less than 1 mg/l.

* * * * *